United States Patent [19]

Feuerbaum et al.

[11] Patent Number: 4,812,651

[45] Date of Patent: Mar. 14, 1989

[54] SPECTROMETER OBJECTIVE FOR PARTICLE BEAM MEASURING INSTRUMENTS

[75] Inventors: Hans-Peter Feuerbaum, Munich; Juergen Frosien, Ottobrunn, both of Fed. Rep. of Germany

[73] Assignee: Siemens Aktiengesellschaft, Berlin and Munich, Fed. Rep. of Germany

[21] Appl. No.: 120,133

[22] Filed: Nov. 13, 1987

[30] Foreign Application Priority Data

Nov. 13, 1986 [DE] Fed. Rep. of Germany ....... 3638682

[51] Int. Cl.$^4$ .............................................. H01J 37/26
[52] U.S. Cl. ................................... 250/310; 250/305; 250/397
[58] Field of Search ..................... 250/305, 310, 397; 324/71.3, 409

[56] References Cited

U.S. PATENT DOCUMENTS

| | | | |
|---|---|---|---|
| 3,896,308 | 7/1975 | Venables | 250/310 |
| 4,514,682 | 4/1985 | Feuerbaum | 324/409 |
| 4,587,425 | 5/1986 | Plows | 250/310 |
| 4,658,137 | 4/1987 | Garth et al. | 250/310 |
| 4,675,524 | 6/1987 | Frosien et al. | 250/310 |
| 4,683,376 | 7/1987 | Feuerbaum | 250/310 |
| 4,694,170 | 9/1987 | Slodzian et al. | 250/310 |

OTHER PUBLICATIONS

Publication by E. Plies and J. Kolzer, entitled: "A New Objective Lens with In-Lens Spectrometer for Electron Beam Testing", pp. 625-626, 1986.

*Primary Examiner*—Bruce C. Anderson

[57] ABSTRACT

A spectrometer objective includes a generally asymmetrical objective lens having a short focal length, a deflection system disposed within the objective lens symmetrically relative to an optical axis, and an electrostatic retarding field spectrometer including an electrode arrangement for accelerating the secondary electrons generated on the specimen. The electrode arrangement of the retarding field spectrometer includes an electrode pair for establishing a spherically symmetrical retarding field. The electrode arrangement for extracting and accelerating the secondary particles includes a grid electrode disposed in a region of the lower pole piece of the objective lens and of a planar electrode disposed in the particle beam path immediately above the specimen, wherein the planar electrode is charged with a potential lying between the potential of the specimen and the potential of the grid electrode.

18 Claims, 3 Drawing Sheets

SPECTROMETER OBJECTIVE FOR PARTICLE BEAM MEASURING INSTRUMENTS

BACKGROUND OF THE INVENTION

1. Field of the Invention

The present invention is directed generally to particle beam measuring instruments, and more specifically to an improved electrode arrangement in a spectrometer objective.

2. Description of the Related Art

A spectrometer objective is known from the publication by E. Plies, entitled "A New Objective Lens with In-Lens Spectrometer for Electron Beam Testing", Proc. XIth International Congress on Electron Microscopy, Kyoto, Japan, Aug. 31-Sept. 7, 1986, pages 625–626. The disclosed spectrometer objective is essentially composed of a magnetic objective lens having a short focal length, a deflection unit arranged within the objective lens, and an retarding field spectrometer which together form the components of an electron-optical column of an electron beam measuring instrument. The disclosed objective lens is used to focus both the primary electrons emitted by a high-current electron source, as well as secondary electrons generated at a specimen by the primary electrons. The secondary electrons are focused by the objective lens to a point lying along the optical axis of the measuring instrument. The focus of the secondary electrons which have been accelerated to high kinetic energies lies in the center of a spherically symmetrical retarding field that is generated by a portion of the spectrometer disposed above the objective lens. The spherically symmetrical retarding field is generated with the assistance of an appropriately formed electrode pair.

To guarantee good focusing of the secondary electrons, one is forced to provide a high positive potential to the extraction electrode disposed immediately above the specimen. High extraction fields ($E = 1-2 \ kV/mm$) in the region of the specimen, however, should be avoided, particularly when checking the operation of micro-electronic components. In addition, the uniformity of the extraction field is disturbed particularly for highly structured specimens, and this has an unfavorable effect on the topical resolution of the electron beam measuring instrument, which is determined by the diameter of the electron probe on the specimen.

SUMMARY OF THE INVENTION

An object of the present invention is to provide a spectrometer objective which has imaging properties that are not influenced by the structure of the specimen being investigated.

Another object of the invention is to avoid damage to a specimen from high extraction fields in a spectrometer objective.

These and other objects are inventively achieved by a spectrometer objective which includes a third electrode in the path of the primary particle beam disposed immediately above the specimen and lying at a predetermined potential. In one development, this predetermined potential lies between that applied to the specimen and that applied to the extraction electrode, and, in particular, is the same as that applied to the specimen.

An advantage of the present invention is that even highly structured specimens, and especially LSI circuits on a semiconductor wafer, can be investigated with a high spatial resolution using a particle beam measuring instrument.

Further developments and improvements of the invention include mounting the third electrode either in the pole piece gap of the objective lens or at the lower pole piece. An annular mount may be provided for holding the third electrode to the objective lens. The third electrode, which is generally planar, can either be a grid or a diaphram, for example. Where a second electrode arrangement in the retarding field spectrometer includes concentric spherically-shaped electrodes, the invention can include a deflection system having a center at the center of the spherically-shaped electrodes.

DESCRIPTION OF THE PREFERRED EMBODIMENTS

Figure 1:
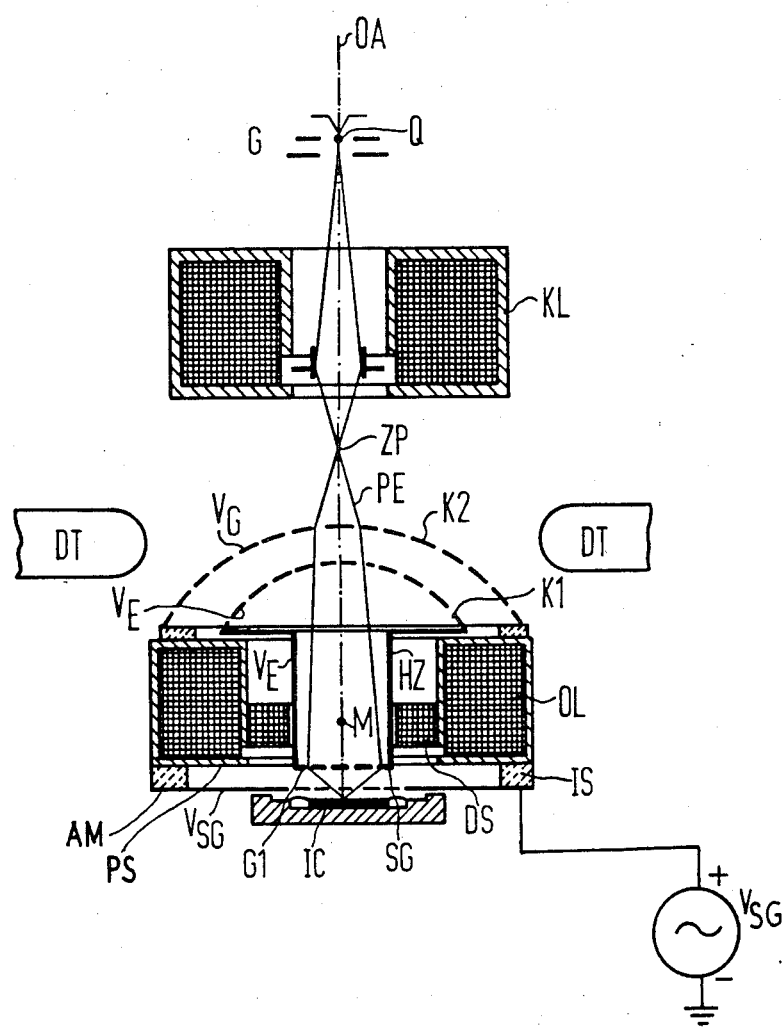
FIG. 1 is a vertical cross section of a particle-optical unit for a particle beam apparatus showing the spectrometer objective of the present invention.
Figure 2:
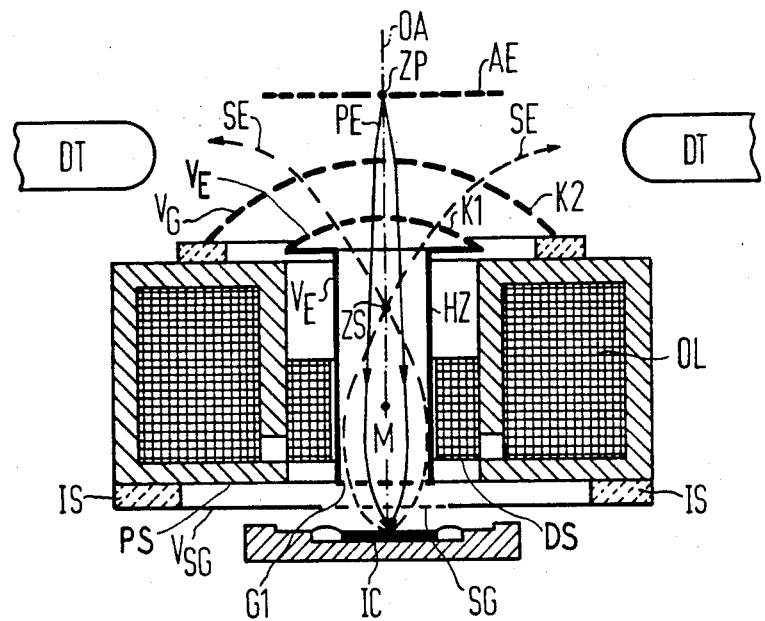
FIG. 2 is a vertical cross section of a second embodiment of a spectrometer objective of the invention.

A spectrometer objective is shown schematically in FIGS. 1 and 2 essentially having a largely asymmetrical objective lens OL of short focal length, a one-stage deflection system DS disposed within a magnetic lens OS symmetrically disposed relative to an optical axis OA, and an electrostatic retarding field spectrometer. The retarding field spectrometer has an electrode arrangement SG and G1 for accelerating the secondary electrons SE generated at a specimen IC, which may be an integrated circuit. Also included is an electrode pair K1 and K2 for generating a spherically symmetrical opposing field. The system composed of the objective lens OL, the deflection unit DS, and the spectrometer forms a component of the electron-optical column of an electron beam measuring instrument shown schematically in FIG. 1.

The electron beam measuring instrument provides a beam of primary electrons PE emitted by a beam generator G which is focused and deflected along the electron-optical column. The primary electrons PE generate the secondary electrons SE on the specimen IC, and the secondary electrons SE are extracted from the specimen IC and imaged in a point ZS lying along the optical axis OA. To generate a fine electron probe having a beam diameter in the sub-micrometer range ($d_{PE} = 0.1 \ \mu m$), the electron source Q, or an intermediate image ZP thereof generated by a condensor lens KL, is projected demagnified on the specimen IC which is arranged in the immediate proximity of the back focal plane of the magnetic lens. The image of the electron source Q is projected with the assistance of the spectrometer objective. The deflection unit DS is used to position the primary electron beam PE to a point on the specimen IC or in line-by-line deflections thereacross.

For documenting the low energy secondary electrons (those with energies $S_{SE} < 50$ eV) generated at the point of incidence of the primary electrons PE and emitted over a large solid angle range, the secondary electrons SE are extracted from the specimen IC and are accelerated to kinetic energies of between about 1 and 5 keV in the direction of the objective lens OL. The secondary electrons SE are accelerated by a uniform electrical field generated by the electrode arrangement SG and G1.

In accordance with the present invention, the electrode arrangement for extracting and accelerating the secondary electrons SE is composed of a planar electrode SG disposed in the beam path immediately above the specimen IC and a grid or grating electrode G1 arranged in the region of a lower pole piece PS of the objective lens OL, the grid electrode G1 preferrably being charged with a highly positive potential $V_E$ of about 1 through 5 kV. The planar electrode is either held spaced from the lower pole piece PS or is within the pole piece gap. When the planar electrode SG is insulated from the lower pole piece PS to which it is held, or when it is held within the pole piece gap, it is charged with a potential $V_{SG}$ which is between the potential of the specimen (which is normally ground potential) and the potential $V_E$ of the electrode G1 so that the electrical field strength in the region of the specimen IC is held below a critical value. The planar electrode SG is preferrably charged with a voltage of 0 through 100 volts, inclusive. The presence of the planar electrode SG ensures that any irregularities of the specimen surface have no influence on the uniformity of the electrical field established between the electrodes SG and G1.

Figure 4:
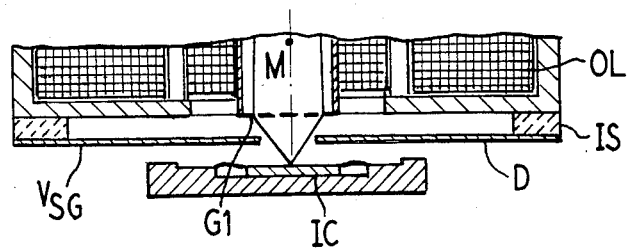
FIG. 4 is a fragmentary cross section of an embodiment similar to that shown in FIG. 1, including an apertured diaphram electrode.

The lower planar electrode SG is preferrably formed as a grid or grating held in an annular mounting portion AM that is separated from the lower pole piece of the objective lens OL by insulators IS. The annular mounting portion AM is conductively connected to a variable voltage source shown schematically in FIG. 1. Of course, an apertured diaphram electrode D shown in FIG. 4 can also be used in place of the grid or grating planar electrode SG. The same voltage $V_{SG}$, however, would be applied to the diaphram electrode D.

The accelerated secondary electrons SE pass through the planar electrode SG and the grid electrode G1 and proceed into the magnetic field of the objective lens OL between the pole piece PS so that they are focused in a point ZS lying on the optical axis OA. The position of the focusing point ZS is determined by the amplitude of the potential $V_E$ applied to the grid electrode G1 and is further determined by the magnetic field strength in the pole piece gap dependent on the primary electron energy. The focusing point ZS is to be interpreted as a real intermediate image of the virtual source of the secondary electrons SE, in other words, the smallest caustic cross section of all, virtual secondary electron paths under the specimen IC.

Good focusing of secondary electrons SE in the field of the objective lens OL is first guaranteed by the acceleration of the secondary electrons SE to high kinetic energies ($E_{SE}$=1-5 KeV), since only then the focusing point of the secondary electrons SE emitted at the measuring point with different energies ($0 < E_0 < 50$ ev) is nearly equal. Since, for high accelerating potentials $V_E$, the primary electrons PE also traverse the objective lens OL with high energy, the disadvantageous influence of the Boersch effect (the Coulomb interaction of the electrons in the primary beam) on the probe diameter is reduced in this part of the electron-optical column.

The deceleration and energy analysis of the secondary electrons SE ensues either inside, or as shown in FIGS. 1 and 2, above the objective lens OL. The spherically-symmetrical electrical retarding field is used for the deceleration and energy analysis, the field being established in a spacial region between two nearly hemispherical grid or grating electrodes K1 and K2 lying at mutually different potentials $V_E$ and $V_G$, respectively. The lower hemispherical grid electrode K1 lies at the potential $V_E$ of the electrode G1, and the upper hemispherical grid electrode K2 is generally charged with a potential of between approximatel $-15$ volts and $+15$ volts. A shielding electrode BG (shown in FIG. 3) is also provided above the electrode arrangement K1 and K2 to build up the retarding field. The potential of the shielding electrode BG is preferrably selected to be equal to a potential $V_G$ of the upper hemispherical electrode K2.

To avoid Lamor rotations of the secondary electrons SE inside the objective lens OL, the secondary electron focus point ZS preferrably lies above the pole piece PS and the deflection unit DS. It is, thus, possible to obtain a better focus of the secondary electrons SE at a point ZS on the optical axis OA above the deflection unit DS the lower the energy of the primary electrons PE is and the higher the potential $V_E$ of the electrode G1 is which accelerates the secondary electrons SE. To avoid having the electrical fields within the objective lens OL disturb the movement of the secondary electrons SE, the hemispherical grid electrode K1 is connected to the electrode G1 in conductive fashion by a hollow cylinder HZ arranged concentrically about the optical axis OA.

The only guarantee of documenting the secondary electrons SE which is independent of their emission angle is to have the paths of the secondary electrons SE proceed parallel to the field lines to the electrical retarding field and, thus, perpendicular to the electrodes K1 and K2. This condition is always met for the central ray of the secondary electron lobe when the common center of the grid electrodes K1 and K2 lies on the optical axis OA in a middle point M of the deflection system DS. Since the secondary electron lobe (shown in FIG. 2) is tilted about the point M when the primary beam PE is scanned, a documentation which is location-independent and angle-independent for the secondary electrons SE emitted in the direction of the symmetry axis of the lobe is achieved by one or more detectors DT arranged symmetrically relative to the optical axis OA. When a symmetrical detector arrangement is used, an electrode AE lying at a negative potential can also be provided above the grid electrodes K1 and K2. The electrode AE deflects any secondary electrons SE emitted in the direction of the optical axis OA.

Figure 3:
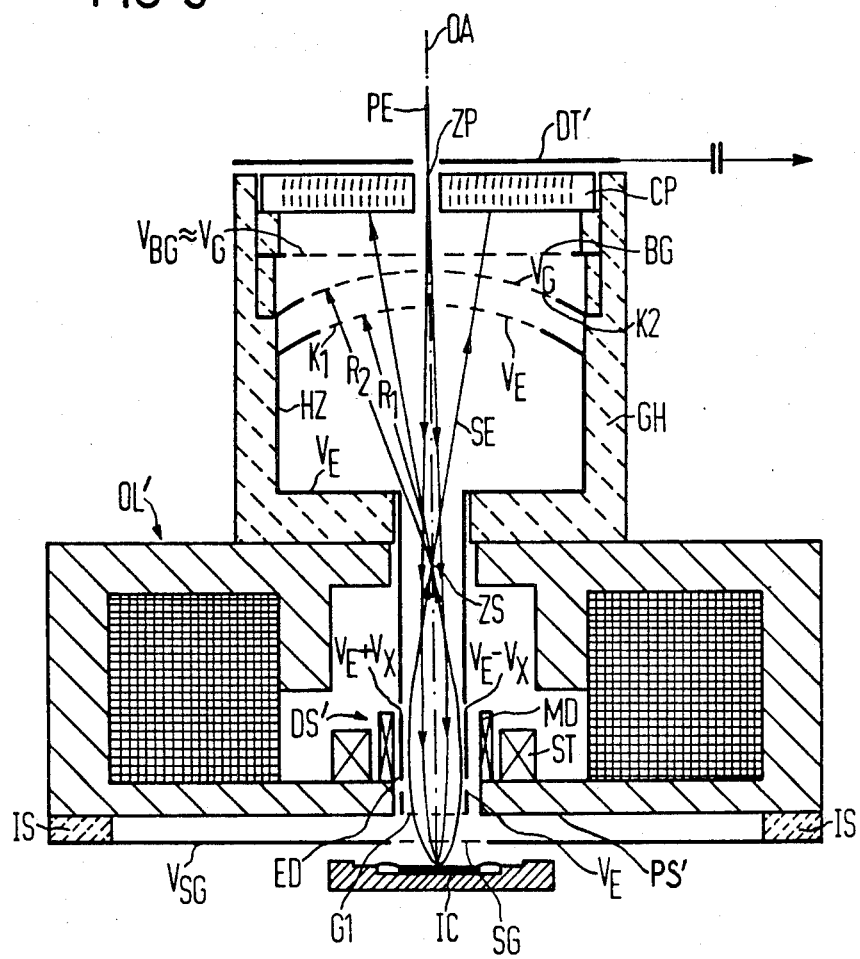
FIG. 3 is a vertical cross section of a further embodiment of the present spectrometer objective.

In FIG. 3 is shown a spectrometer objective essentially composed of an objective lens OL' having a short focal length, a deflection unit DS' arranged inside the objective lens OL' symmetrically relative to the optical axis OA, and an electrostatic retarding field spectrometer. The spectrometer includes an electrode arrangement SG and G1 substantially the same as that shown in FIGS. 1 and 2 for extracting and accelerating the secondary electrons SE, as well as including an electrode arrangement K1 and K2 for generating a spherically symmetrical retarding field. The system composed of the objective lens OL', the deflection unit DS' and the retarding field spectrometer forms a component of an electron optical column of an electron beam measuring instrument.

In the measuring instrument, primary electrons PE are emitted by a high current electron source and are focused and deflected onto the specimen IC. The secondary electrons SE generated at the specimen IC by the primary electrons PE are focused into a center ZS of the spherically symmetrical retarding field lying along the optical axis OA. The retarding field is generated by the grid electrodes K1 and K2 mounted within a housing GH above the objective lens OL'. The grid electrodes K1 and K2 form respective parts of the surfaces of concentric spheres having mutually different radii $R_1$ and $R_2$, respectively. In an exemplary embodiment, the radius $R_1$ is approximately equal to 30 mm and the radius $R_2$ is approximately equal to 40 mm. Since the center point ZS of the spheres formed in part by the grid electrodes K1 and K2 defines the center of the retarding field which in turn lies at a great distance above the deflection unit DS and above the pole piece gap, Lamor rotations of the secondary electrons SE are avoided after they traverse the intermediate image ZS. The deflection unit DS' is preferrably formed of magnetic and electrical deflection elements MD and ED, respectively.

To generate a space free of electrical fields in the region of the secondary electron focus point ZS, a hollow cylinder HZ composed of three parts and arranged symmetrically relative to the optical axis OA is provided in the housing GH, which is closed off by an annular secondary electron detector DT'. A shielding grid BG and a channel plate CP or a semiconductor detector for documenting the secondary electrons SE are situated in the housing GH in addition to the electrodes K1 and K2. The upper portion of the hollow cylinder HZ tapers in the region of the objective lens OL and is conductively connected to the electrode K1 which is maintained at a potential $V_E$. A lower portion of the hollow cylinder HZ has the electrode G1 at the end thereof lying at a potential $V_E$, wherein $V_E$ is between 0.5 and 5 kV, and in a particular utilization is 2 kV.

Like the known spectrometer objective disclosed in the Plies publication, the central cylinder portion surrounded by the magnetic deflection element MD is formed as an electrostatic, octopole deflector ED whose individual electrodes are charged either positively or negatively with a further potential $V_X$ for deflecting the primary beam. A stigmator ST is provided for compensating for astigmatism, yet can be omitted when the electrodes of the octopole deflector ED are provided with suitable auxiliary voltages. To avoid unwanted deflection of the secondary electrons SE, a uniform electrical and magnetic field is generated by the deflection unit DS in a spacial orientation relative to one another in the fashion of a Wien filter so that the field vectors reside perpendicularly relative to one another and also perpendicular to the velocity vector of the secondary electrons SE. The field strenths E and B, respectively, are matched to one another such that the Lorenz force acting on the secondary electrons SE is nullified. In other words, $E/B = v_{SE}$ applies where $v_{SE}$ indicates the main velocity of the secondary electrons SE in the region of the deflection unit DS.

Due to an electrical delay field superimposed on the focusing magnetic field of the objective lens, spectrometer objectives have noticeably lower chromatic aberration constants and spherical aberration constants than magnetic single lenses. Since the imaging properties of such systems are essentially determined by the uniformity and the strength of the delay field, the theoretically possible resolution limit is not achievable as a consequence of the field distortion in the present conventional spectrometer objectives at the specimen surface, the resolution limit being defined as the beam diameter on the specimen. It is only with the inventive decoupling of the delay field from the specimen that the improved imaging properties of electrostatic magnetic lenses can take unrestricted effect.

The invention, of course, is not limited to the exemplary embodiments shown in FIGS. 1 thru 4. Thus, for example, it is possible to arrange the electrode arrangement K1 and K2 within the objective lens, and, under certain conditions, to also arrange the detector system DT completely within the objective lens OL.

FIGS. 2 and 3 are directed to spectrometer objectives which have integrated deflection systems DS and DS'. The deflection systems DS and D S', of course, can also be arranged about the particle beam path above the objective lens in a conventional fashion. However, it must be accepted that the disadvantageous influence of the Boersch effect on the probe diameter is magnified by lengthening the beam path.

A planar electrode pair can also be used for generating the retarding field instead of spherically symmetrical electrodes K1 and K2. However, it is not possible with such an arrangement to document the secondary electrons SE independently of their emmision angles.

Although other modifications and changes may be suggested by those skilled in the art, it is the intention of the inventors to embody within the patent warranted hereon all changes and modifications as reasonably and properly come within the scope of their contribution to the art.

We claim:

1. An improved spectrometer objective for use in a particle beam measuring instrument having a particle beam directed onto a specimen and an electrode arrangement for generating an retarding electrical field, the improvement comprising:
    an extraction grid electrode at a first predetermined potential for extracting and accelerating secondary particles generated at the specimen by the particle beam toward the retarding electrical field; and
    a planar electrode disposed between said extraction grid electrode and the speciment and having a second predetermined potential, said second predetermined potential being less than said first predetermined potential and not less than the potential of the specimen to provide a uniform electrical field between said planar electrode and said extraction electrode.

2. An improved spectrometer objective as claimed in claim 1, wherein said first predetermined potential is in the range of 1 through 5 kilovolts,
    said second predetermined potential is in the range of 0 through 100 volts, and
    said planar electrode is disposed immediately above the specimen.

3. A spectrometer lens, comprising:
    a magnetic lens operable to focus a primary particle beam onto a specimen and having a lower pole piece;
    a retarding field spectrometer having:
    a planar first electrode arranged immediately above the specimen and connectable to a first potential, said first electrode being immediately under or within said lens,
    a planar second electrode arranged above said first electrode in or at said lower pole piece of said magnetic lens, said second electrode being connectable to a second potential wherein said first and second potentials establish a uniform electrical field in a special region between said first and second electrodes for accelerating the secondary particles triggered at said specimen by the primary particle beam in a direction of said magnetic lens, and third and fourth electrodes arranged above said second electrode, said third electrode being connectable to said second potential and said fourth electrode being connectable to a potential which establishes an electrical field in a spacial region between said third and fourth electrodes for decelerating said secondary particles.

4. A spectrometer lens as claimed in claim 3, wherein said first electrode and said specimen are both at said first potential.

5. A spectrometer lens as claimed in claim 3, wherein said first potential connectable to said first electrode is between approximately 0 and 100 volts, inclusive.

6. A spectrometer lens as claimed in claim 3, wherein said first electrode is held at said lower pole piece of said magnetic lens.

7. A spectrometer lens as claimed in claim 3, wherein said first electrode is held within said lower pole piece of said magnetic lens.

8. A spectrometer lens as claimed in claim 3, wherein said first electrode includes an annular mounting part.

9. A spectrometer lens as claimed in claim 3, wherein said first electrode is a grid electrode.

10. A spectrometer lens as claimed in claim 3, wherein said first electrode is a diaphram electrode.

11. A spectrometer lens as claimed in claim 3, wherein said third and fourth electrodes are arranged above said magnetic lens.

12. A spectrometer lens as claimed in claim 3, wherein said third and fourth electrodes are arranged inside said magnetic lens.

13. A spectrometer lens as claimed in claim 3, wherein said third electrode is shaped as a surface portion of a first sphere having a first radius, said fourth electrode being shaped as a surface portion of a second sphere having a second radius, said first and second spheres having centers coincident at a point lying on an optical axis of said magnetic lens so that said potentials connectable to said third and fourth electrodes establish a spherically symmetrical retarding field in a spacial region between said third and fourth electrodes.

14. A spectrometer lens as claimed in claim 13, wherein said coincident centers of said first and second spheres lie in a space free of electrical fields.

15. A spectrometer lens as claimed in claim 14 wherein said deflection system is Wien filter.

16. A spectrometer lens as claimed in claim 13, further comprising:

a deflection system having a center point said center point of said deflection system being coincident with said centers of said first and second spheres.

17. A spectrometer lens as claimed in claim 16, wherein said deflection system is a Wien filter.

18. A spectrometer lens as claimed in claim 3, further comprising:

a deflection system integrated into said magnetic lens and arranged above said second electrodes.

* * * * *